United States Patent
Liang

(10) Patent No.: US 12,557,288 B2
(45) Date of Patent: Feb. 17, 2026

(54) MEMORY STRUCTURE WITH REDUCED BRIDGING AND MANUFACTURING METHOD THEREOF

(71) Applicant: MACRONIX International Co., Ltd., Hsinchu (TW)

(72) Inventor: Li-Yen Liang, Kaohsiung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 448 days.

(21) Appl. No.: 18/168,582

(22) Filed: Feb. 14, 2023

(65) Prior Publication Data

US 2024/0276717 A1 Aug. 15, 2024

(51) Int. Cl.
*H10B 43/27* (2023.01)

(52) U.S. Cl.
CPC .................... *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50;
(Continued)

(56) References Cited

U.S. PATENT DOCUMENTS

2016/0111437 A1* 4/2016 Pang ...................... H10D 30/63
257/324
2019/0123061 A1* 4/2019 Liu ........................ G11C 11/2273
(Continued)

FOREIGN PATENT DOCUMENTS

| TW | 202201744 | 1/2022 |
| TW | I785764 | 12/2022 |
| WO | 2022132382 | 6/2022 |

OTHER PUBLICATIONS

"Office Action of Taiwan Counterpart Application", issued on Jan. 24, 2024, pp. 1-7.

*Primary Examiner* — William B Partridge
*Assistant Examiner* — Gustavo G Ramallo
(74) *Attorney, Agent, or Firm* — J.C. PATENTS

(57) ABSTRACT

A memory structure, applicable to a three-dimensional AND flash memory device, is provided. The memory structure includes a substrate, a stack structure, a channel pillar, charge storage structures, a first conductive pillar, a second conductive pillar, and an isolation pillar. The stack structure is located on the substrate and includes first dielectric layers and conductive layers alternately stacked. The channel pillar passes through the stack structure. Each charge storage structure is located between the corresponding conductive layer and the channel pillar. The first conductive pillar and the second conductive pillar are located within the channel pillar. The first conductive pillar and the second conductive pillar are separated from each other. The isolation pillar is located between the first conductive pillar and the second conductive pillar. The top of the isolation pillar is higher than the top of the first conductive pillar and the top of the second conductive pillar.

20 Claims, 14 Drawing Sheets

(58) Field of Classification Search
CPC ........ H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2020/0381450 A1* | 12/2020 | Lue | H10D 30/69 |
| 2021/0335804 A1* | 10/2021 | Yeh | H10B 43/10 |
| 2022/0165746 A1* | 5/2022 | Lee | H01L 23/5226 |
| 2023/0009932 A1 | 1/2023 | Lee et al. | |

* cited by examiner

MEMORY STRUCTURE WITH REDUCED BRIDGING AND MANUFACTURING METHOD THEREOF

BACKGROUND

Technical Field

The disclosure relates to a semiconductor structure and a manufacturing method thereof, and in particular to a memory structure and a manufacturing method thereof.

Description of Related Art

The non-volatile memory has the advantage that the stored data does not disappear after power outage, so the non-volatile memory is widely used in personal computers and other electronic equipment. The development of three-dimensional memory devices has gradually become the current trend. The three-dimensional memory device usually has a vertical channel pillar and a source pillar and a drain pillar located within the channel pillar. However, during the manufacturing process of the three-dimensional memory device, bridging is often generated between the source pillar and the drain pillar, which leads to memory device failure.

SUMMARY

The disclosure provides a memory structure and a manufacturing method thereof, which can effectively prevent unnecessary bridging between a source pillar and a drain pillar, thereby preventing memory device failure.

The disclosure provides a memory structure, including a substrate, a stack structure, a channel pillar, multiple charge storage structures, a first conductive pillar, a second conductive pillar, and an isolation pillar. The stack structure is located on the substrate. The stack structure includes multiple first dielectric layers and multiple conductive layers alternately stacked. The channel pillar passes through the stack structure. Each charge storage structure is located between the corresponding conductive layer and the channel pillar. The first conductive pillar and the second conductive pillar are located within the channel pillar. The first conductive pillar and the second conductive pillar are separated from each other. The isolation pillar is located between the first conductive pillar and the second conductive pillar. A top of the isolation pillar is higher than a top of the first conductive pillar and a top of the second conductive pillar.

According to an embodiment of the disclosure, in the memory structure, the top of the isolation pillar may be higher than a top of the channel pillar.

According to an embodiment of the disclosure, in the memory structure, the first conductive pillar may be connected to the channel pillar. The second conductive pillar may be connected to the channel pillar.

According to an embodiment of the disclosure, the memory structure may further include a dielectric liner layer. The dielectric liner layer is located on a sidewall and a bottom surface of the isolation pillar.

According to an embodiment of the disclosure, in the memory structure, a material of the dielectric liner layer is, for example, high density plasma (HDP) oxide.

According to an embodiment of the disclosure, the memory structure may further include a capping layer. The capping layer is located on the top of the isolation pillar. The capping layer may be connected to the dielectric liner layer.

According to an embodiment of the disclosure, in the memory structure, a material of the capping layer is, for example, high density plasma oxide.

According to an embodiment of the disclosure, in the memory structure, the dielectric liner layer and the capping layer may surround the isolation pillar.

According to an embodiment of the disclosure, the memory structure may further include a second dielectric layer. The second dielectric layer is located on the substrate. The second dielectric layer is located between the dielectric liner layer and the first conductive pillar and between the dielectric liner layer and the second conductive pillar.

According to an embodiment of the disclosure, the memory structure may further include a second dielectric layer, a first stop layer, a second stop layer, and a third stop layer. The second dielectric layer is located on the substrate. The first stop layer is located in the second dielectric layer. The first conductive pillar may be connected to the first stop layer. The second stop layer is located in the second dielectric layer. The second conductive pillar may be connected to the second stop layer. The third stop layer is located between the stack structure and the second dielectric layer.

The disclosure provides a manufacturing method of a memory structure, including the following steps. A substrate is provided. A first stack structure is formed on the substrate. The first stack structure includes multiple first dielectric layers and multiple conductive layers alternately stacked. A channel pillar is formed. The channel pillar passes through the stack structure. Multiple charge storage structures are formed. Each charge storage structure is located between the corresponding conductive layer and the channel pillar. The first conductive pillar and the second conductive pillar are formed within the channel pillar. The first conductive pillar and the second conductive pillar are separated from each other. An isolation pillar is formed. The isolation pillar is located between the first conductive pillar and the second conductive pillar. A top of the isolation pillar is higher than a top of the first conductive pillar and a top of the second conductive pillar.

According to an embodiment of the disclosure, in the manufacturing method of the memory structure, a forming method of the first stack structure may include the following steps. A second stack structure is formed on the substrate. The second stack structure includes multiple first dielectric material layers and multiple sacrificial layers alternately stacked. The second stack structure may have a first opening. The first opening may pass through the second stack structure. The first dielectric material layers are patterned to form multiple first dielectric layers. The sacrificial layers are removed to form multiple second openings. Multiple conductive layers are formed in the second openings.

According to an embodiment of the disclosure, in the manufacturing method of the memory structure, multiple charge storage structures may be formed in the second openings. The conductive layers may be formed on the charge storage structures.

According to an embodiment of the disclosure, in the manufacturing method of the memory structure, the channel pillar may be formed on a sidewall of the first opening.

According to an embodiment of the disclosure, in the manufacturing method of the memory structure, a forming method of the isolation pillar may include the following steps. A second dielectric material layer is formed in the first opening. The second dielectric material layer may have a recess. A dielectric liner material layer is formed on the second dielectric material layer and in the recess. An isolation material layer is formed on the dielectric liner material layer and in the recess. An etch-back process is performed on the isolation material layer to form the isolation pillar.

According to an embodiment of the disclosure, in the manufacturing method of the memory structure, a forming method of the dielectric liner material layer is, for example, high density plasma chemical vapor deposition (HDPCVD).

According to an embodiment of the disclosure, in the manufacturing method of the memory structure, a forming method of the first conductive pillar and the second conductive pillar may include the following steps. The dielectric liner material layer and the second dielectric material layer are patterned to form a third opening and a fourth opening. The first conductive pillar is formed in the third opening, and the second conductive pillar is formed in the fourth opening.

According to an embodiment of the disclosure, in the manufacturing method of the memory structure, the dielectric liner material layer may be patterned into a dielectric liner layer. The dielectric liner layer is located on a sidewall and a bottom surface of the isolation pillar.

According to an embodiment of the disclosure, the manufacturing method of the memory structure further includes the following steps. A capping layer is formed on the isolation pillar. The capping layer may be connected to the dielectric liner layer.

According to an embodiment of the disclosure, in the manufacturing method of the memory structure, the second dielectric material layer may be patterned into a second dielectric layer. The second dielectric layer is located between the dielectric liner layer and the first conductive pillar and between the dielectric liner layer and the second conductive pillar.

Based on the above, in the memory structure and the manufacturing method thereof according to the disclosure, since the top of the isolation pillar is higher than the top of the first conductive pillar and the top of the second conductive pillar, unnecessary bridging between the first conductive pillar and the second conductive pillar can be effectively prevented, thereby preventing memory device failure.

In order for the features and advantages of the disclosure to be more comprehensible, the following specific embodiments are described in detail in conjunction with the drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
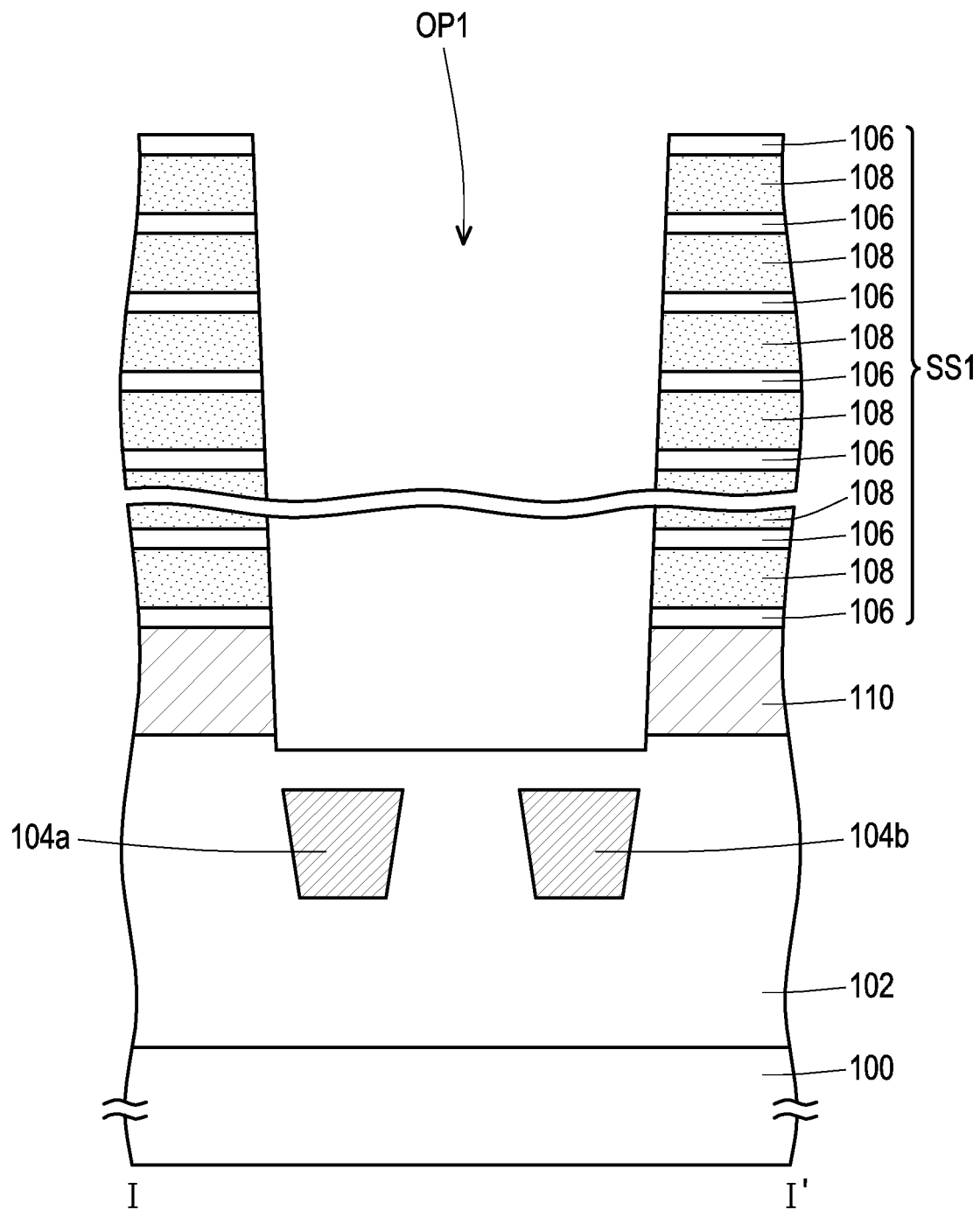
FIG. 1A to FIG. 1I are cross-sectional views of a manufacturing process of a memory structure according to some embodiments of the disclosure.

Embodiments are listed below and described in detail with the drawings, but the provided embodiments are not intended to limit the scope of the disclosure. In order to facilitate understanding, the same components will be described with the same reference numerals in the following description. In addition, the drawings are for illustration purposes only and are not drawn to original scale. In addition, features in the perspective views are not drawn to the same scale as features in the cross-sectional views. In fact, the sizes of various features may be arbitrarily increased or reduced for clarity of discussion.

Figure 1B:
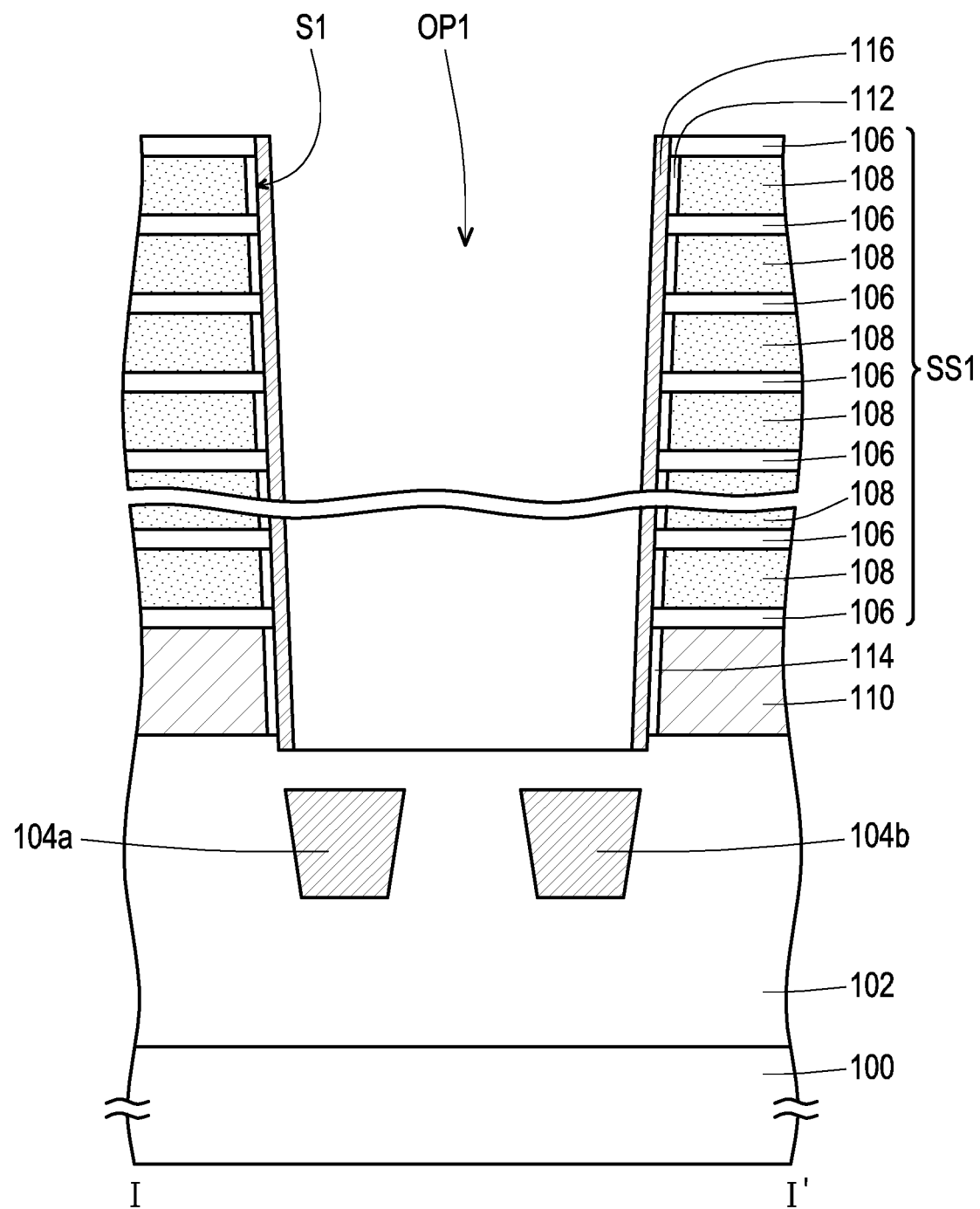
Figure 1C:
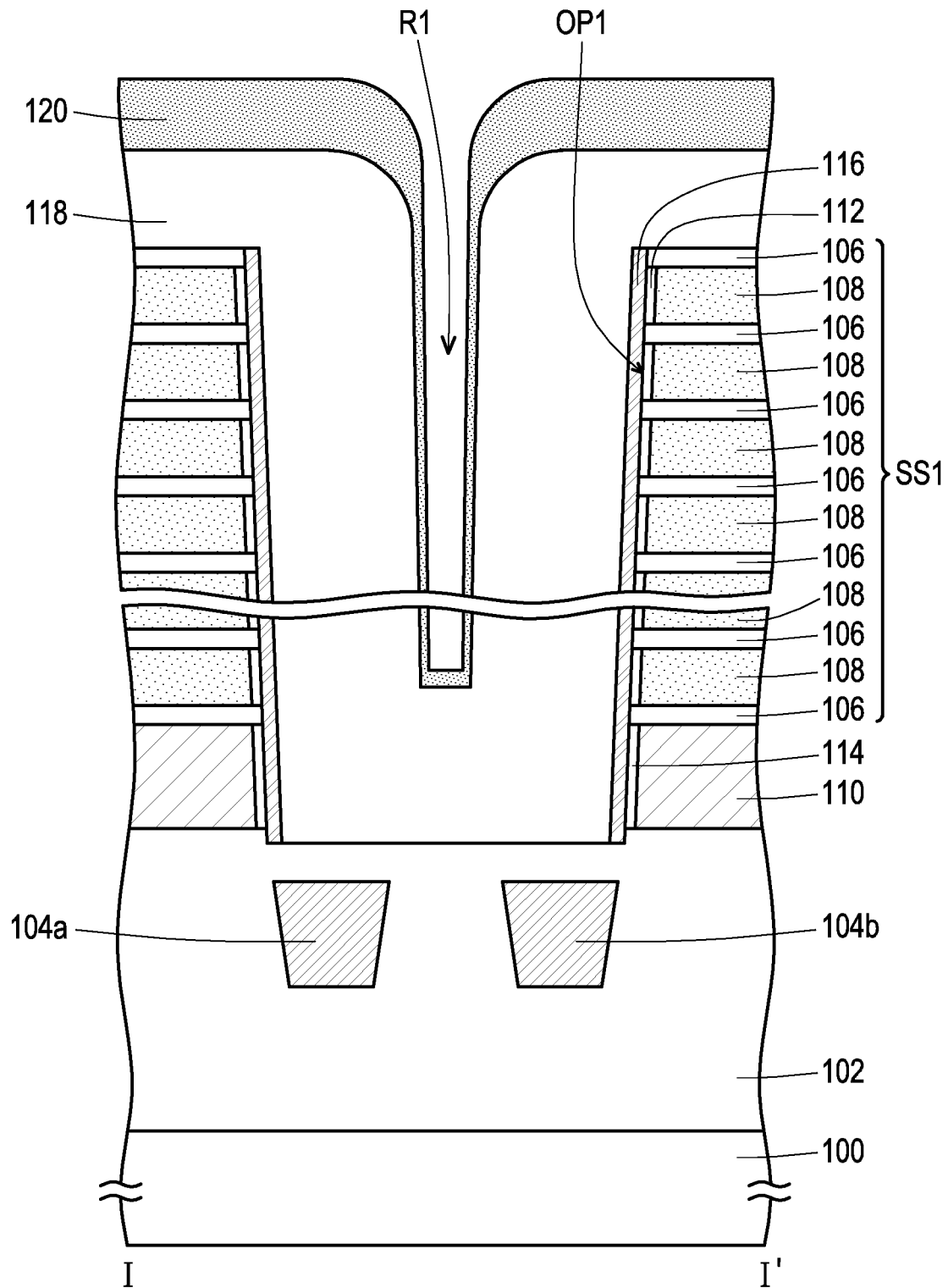
Figure 1D:
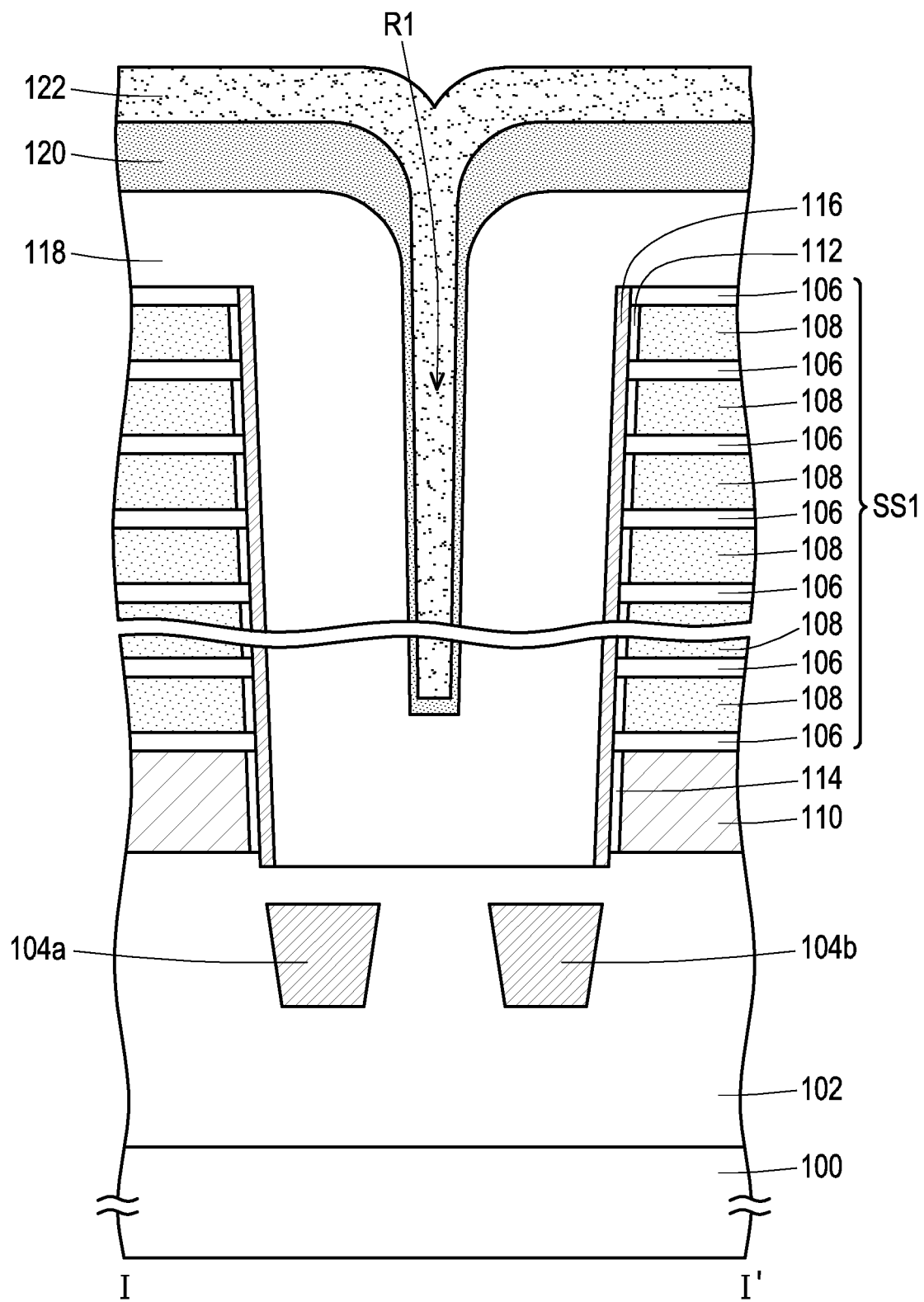
Figure 1E:
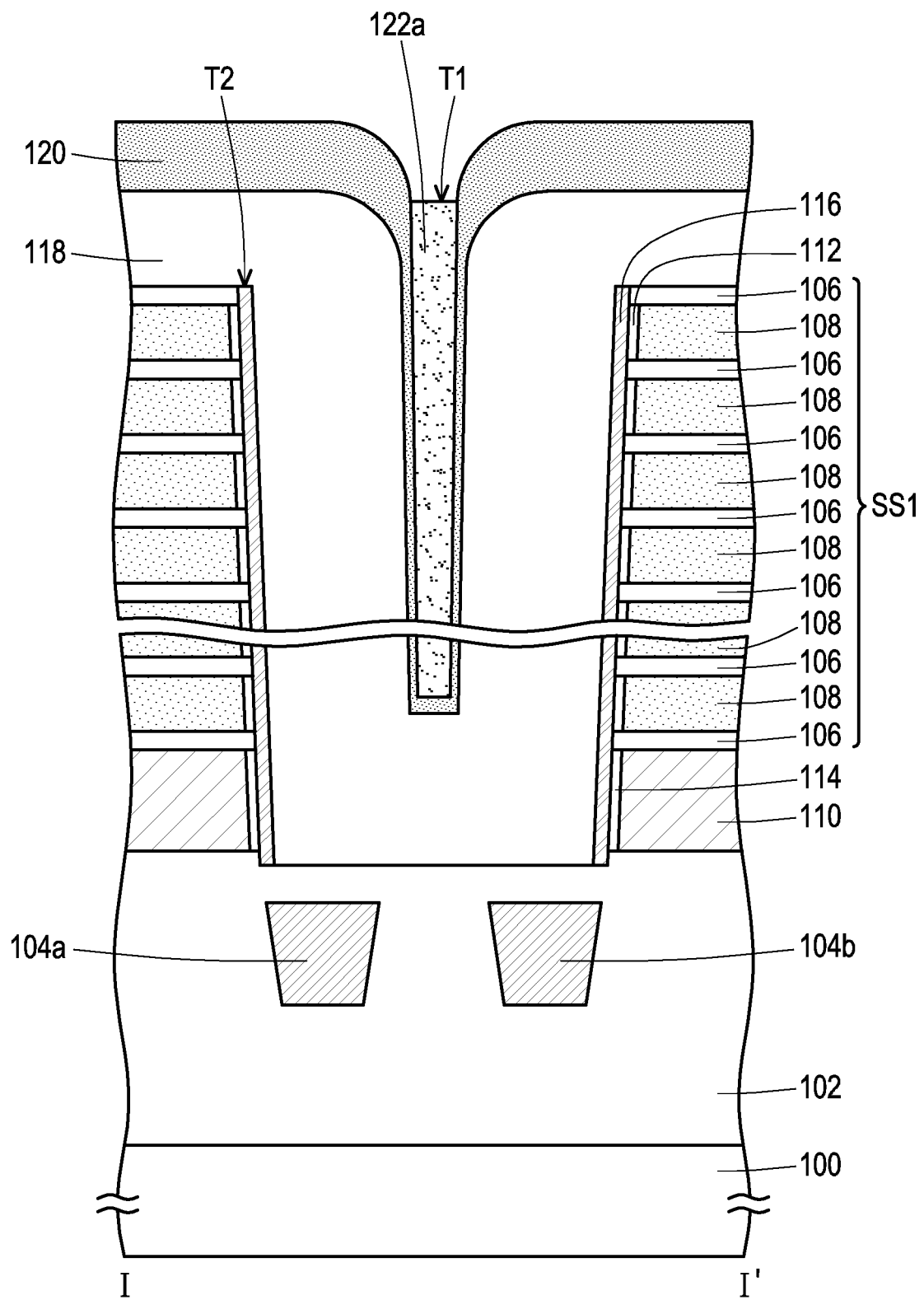
Figure 1F:
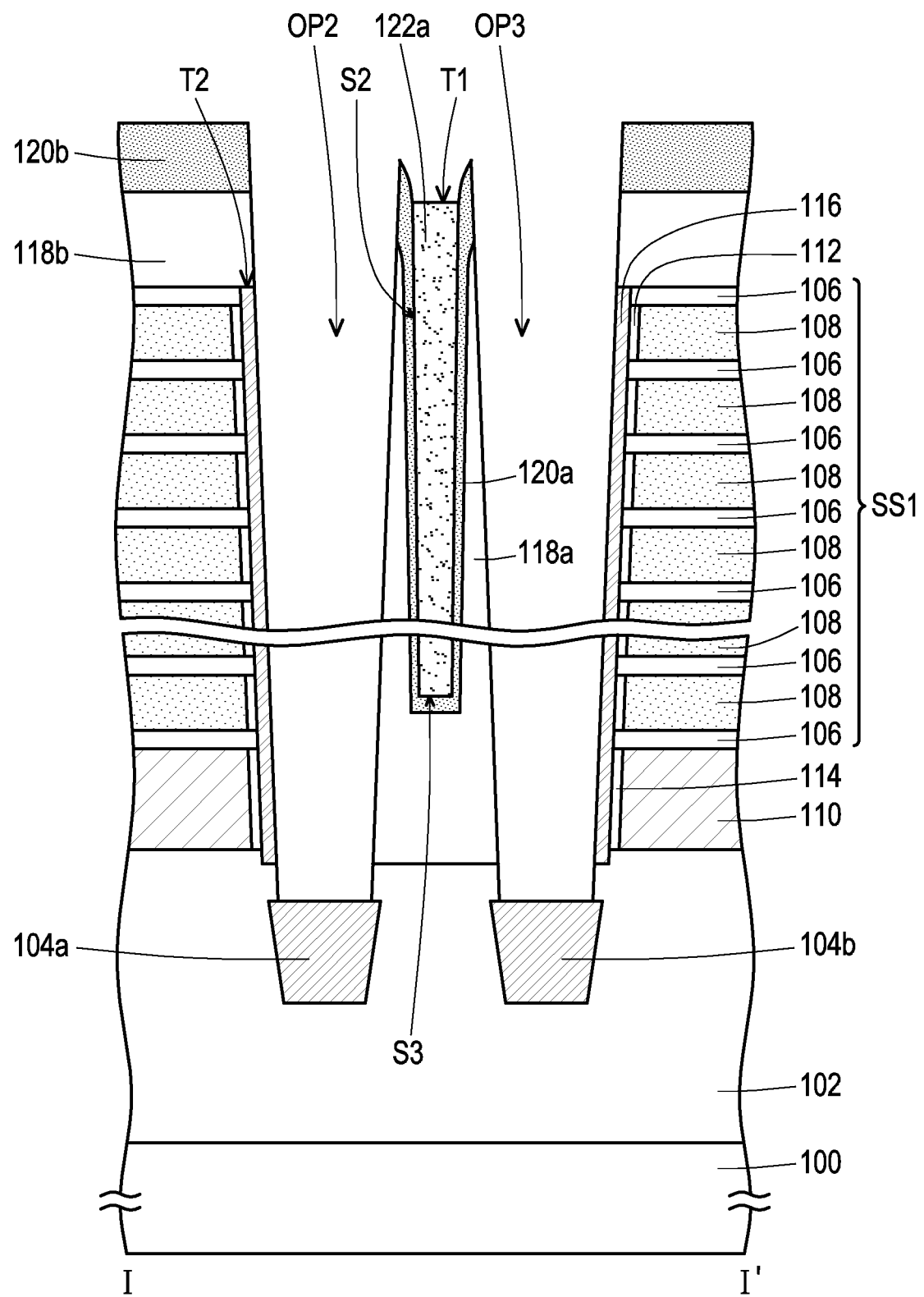
Figure 1G:
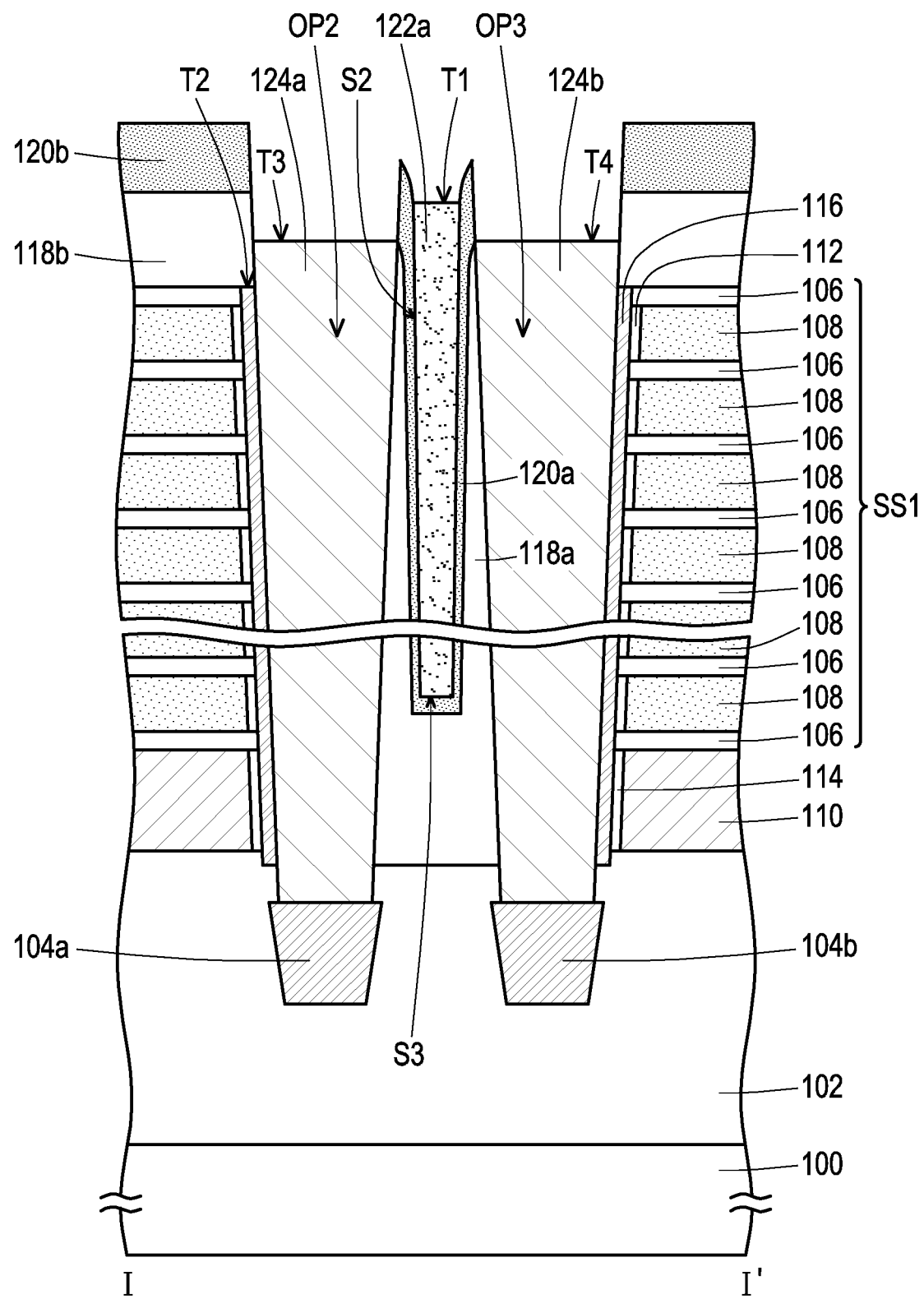
Figure 1H:
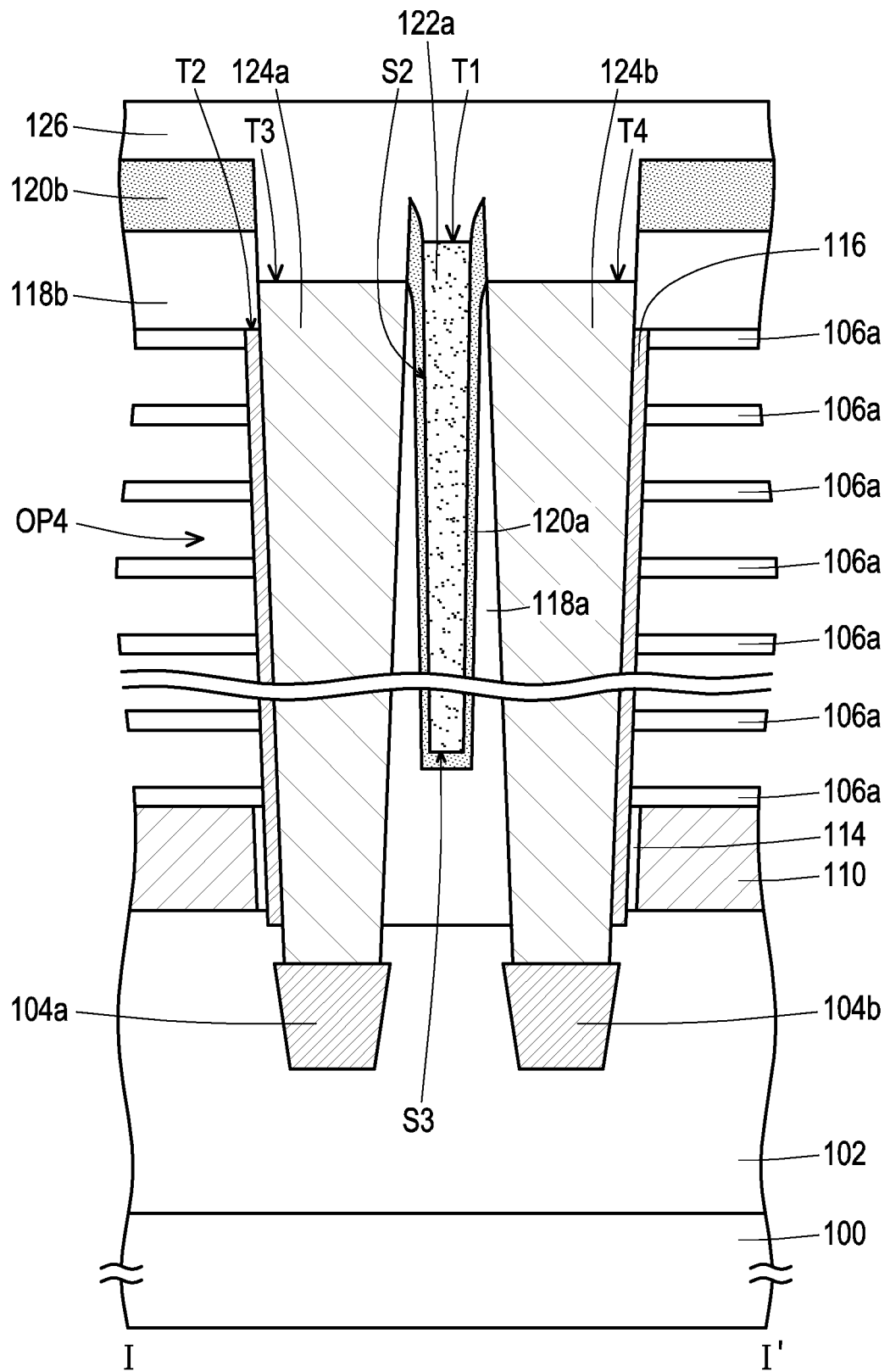
Figure 1I:
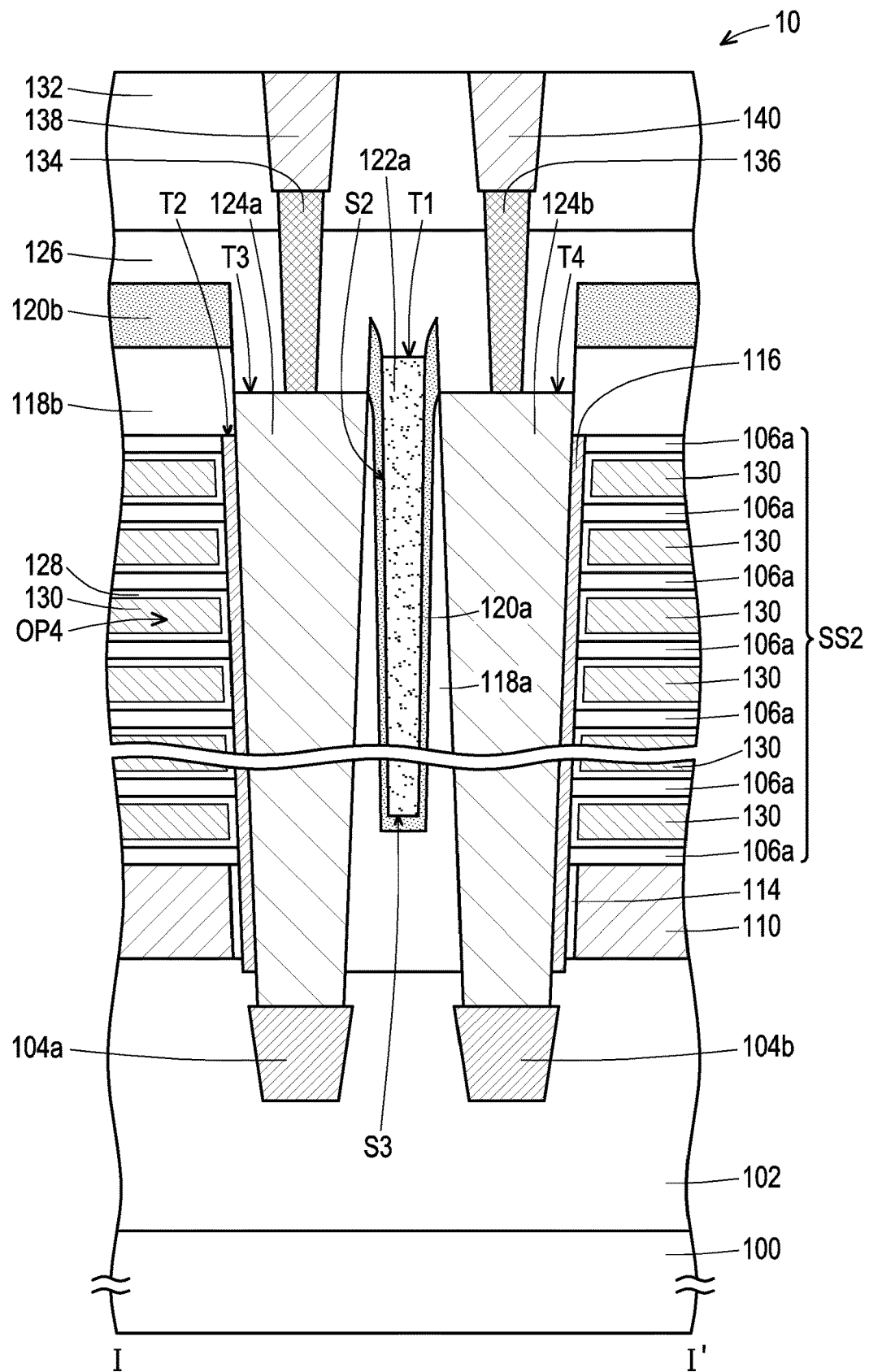
Figure 2:
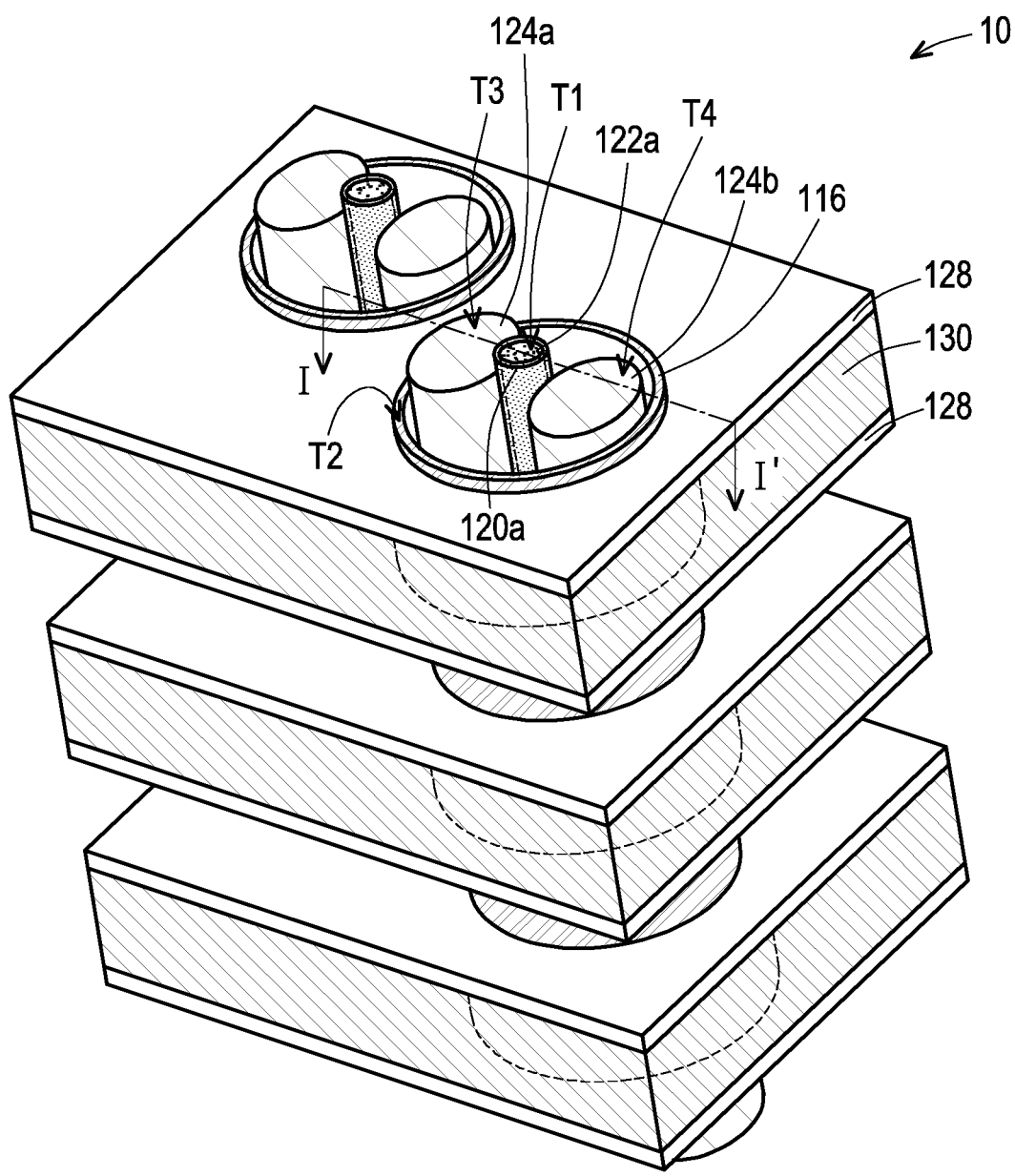
FIG. 2 is a perspective view of some components of the memory structure of FIG. 1I.

FIG. 1A to FIG. 1I are cross-sectional views of a manufacturing process of a memory structure according to some embodiments of the disclosure. FIG. 2 is a perspective view of some components of the memory structure of FIG. 1I. In the perspective view of FIG. 2, some components in the cross-sectional view of FIG. 1I are omitted to clearly illustrate the positional relationship between the components in the perspective view. FIG. 1A to FIG. 1I are cross-sectional views along a cross-sectional line I-I' in FIG. 2.

Referring to FIG. 1A. A substrate 100 is provided. The substrate 100 may be a semiconductor substrate, such as a silicon substrate. In addition, although not shown in the drawing, there may be required components (for example, a doped region, a transistor device, a dielectric layer, and/or an interconnection structure, etc.) in the substrate 100 or on the substrate 100, and the description thereof is omitted here.

Next, a dielectric layer 102, a stop layer 104a, and a stop layer 104b may be formed on the substrate 100. The material of the dielectric layer 102 is, for example, oxide (for example, silicon oxide). The stop layer 104a and the stop layer 104b may be formed in the dielectric layer 102. The material of the stop layer 104a and the material of the stop layer 104b may be conductive materials, such as doped polysilicon.

Then, a stack structure SS1 may be formed on the substrate 100. The stack structure SS1 includes multiple dielectric material layers 106 and multiple sacrificial layers 108 alternately stacked. The stack structure SS1 may have an opening OP1. The opening OP1 may pass through the stack structure SS1. In some embodiments, the stack structure SS1 may be formed on the dielectric layer 102. The material of the dielectric material layer 106 is, for example, oxide (for example, silicon oxide). The material of the sacrificial layer 108 is, for example, nitride (for example, silicon nitride). In some embodiments, a stop layer 110 may be formed between the stack structure SS1 and the dielectric layer 102. The material of the stop layer 110 may be a conductive material, such as doped polysilicon.

In some embodiments, the forming method of the stack structure SS1, the stop layer 110, and the opening OP1 may include the following steps. First, a stop material (not shown) may be formed on the dielectric layer 102. The forming method of the stop material is, for example, chemical vapor deposition. Next, dielectric materials (not shown) and sacrificial materials (not shown) alternately stacked may be formed on the stop material. The forming method of the dielectric material is, for example, chemical vapor deposition. The forming method of the sacrificial material is, for example, chemical vapor deposition. Then, the dielectric materials, the sacrificial materials, and the stop material may be patterned by a lithography process and an etching process (for example, a dry etching process) to form the opening OP1, the dielectric material layers 106, the sacrificial layers 108, and the stop layer 110, so as to form the stack structure SS1. In addition, the opening OP1 may further pass through the stop layer 110.

Referring to FIG. 1B. An oxidation process may be performed to oxidize a part of the sacrificial layer 108 exposed by the opening OP1 into a dielectric layer 112, and oxidize a part of the stop layer 110 exposed by the opening OP1 into a dielectric layer 114. The material of the dielectric layer 112 is, for example, oxide (for example, silicon oxide). The material of the dielectric layer 114 is, for example, oxide (for example, silicon oxide).

Next, a channel pillar 116 may be formed on a sidewall S1 of the opening OP1. The channel pillar 116 may expose the bottom of the opening OP1. The dielectric layer 112 is located between the sacrificial layer 108 and the channel pillar 116. The dielectric layer 114 is located between the stop layer 110 and the channel pillar 116. The material of the channel pillar 116 may be a semiconductor material, such as undoped polysilicon. In some embodiments, the forming method of the channel pillar 116 may include the following steps. First, a channel material layer (not shown) may be conformally formed on the stack structure SS1 and in the opening OP1. The forming method of the channel material layer is, for example, chemical vapor deposition. Next, an etch-back process (for example, a dry etching process) may be performed on the channel material layer to form the channel pillar 116.

Referring to FIG. 1C. A dielectric material layer 118 may be formed in the opening OP1. The dielectric material layer 118 may have a recess R1. The material of the dielectric material layer 118 is, for example, oxide (for example, silicon oxide). In some embodiments, the dielectric material layer 118 may be a high quality oxide (HQO) layer. The forming method of the dielectric material layer 118 is, for example, chemical vapor deposition.

Next, a dielectric liner material layer 120 may be formed on the dielectric material layer 118 and in the recess R1. The material of the dielectric liner material layer 120 is, for example, oxide (for example, silicon oxide). The forming method of the dielectric liner material layer 120 is, for example, chemical vapor deposition. In the embodiment, the material of the dielectric liner material layer 120 is, for example, high density plasma oxide, and the forming method of the dielectric liner material layer 120 is, for example, high density plasma chemical vapor deposition.

Referring to FIG. 1D. An isolation material layer 122 may be formed on the dielectric liner material layer 120 and in the recess R1. The material of the isolation material layer 122 is, for example, nitride (for example, silicon nitride). The forming method of the isolation material layer 122 is, for example, chemical vapor deposition.

Referring to FIG. 1E. An etch-back process may be performed on the isolation material layer 122 to form an isolation pillar 122a. A top T1 of the isolation pillar 122a may be higher than a top T2 of the channel pillar 116. The material of the isolation pillar 122a is, for example, nitride (for example, silicon nitride). The etch-back process is, for example, a wet etching process or a dry etching process.

Referring to FIG. 1F. The dielectric liner material layer 120 and the dielectric material layer 118 may be patterned to form an opening OP2 and an opening OP3. The opening OP2 and the opening OP3 may respectively expose the stop layer 104a and the stop layer 104b. The dielectric liner material layer 120 may be patterned into a dielectric liner layer 120a and a dielectric liner layer 120b. The dielectric liner layer 120a is located on a sidewall S2 and a bottom surface S3 of the isolation pillar 122a. The dielectric liner layer 120b is located directly above the stack structure SS1. The material of the dielectric liner layer 120a and the material of the dielectric liner layer 120b are, for example, oxide (for example, silicon oxide). In the embodiment, the material of the dielectric liner layer 120a and the material of the dielectric liner layer 120b are, for example, high density plasma oxide. The dielectric material layer 118 may be patterned into a dielectric layer 118a and a dielectric layer 118b. The dielectric layer 118a is located between the dielectric liner layer 120a and the opening OP2 and between the dielectric liner layer 120a and the opening OP3. The dielectric layer 118b is located between the dielectric liner layer 120b and the stack structure SS1. The material of the dielectric layer 118a and the material of the dielectric layer 118b are, for example, oxide (for example, silicon oxide). In some embodiments, the dielectric liner material layer 120 and the dielectric material layer 118 may be patterned by a lithography process and an etching process (for example, a dry etching process, a wet etching process, or a combination thereof). In addition, during the etching process, the stop layer 104a and the stop layer 104b may serve etching stop layers.

Referring to FIG. 1G. A conductive pillar 124a may be formed in the opening OP2, and a conductive pillar 124b may be formed in the opening OP3. Accordingly, the conductive pillar 124a and the conductive pillar 124b may be formed within the channel pillar 116. In some embodiments, the conductive pillar 124a may serve as a source pillar, and the conductive pillar 124b may serve as a drain pillar. In other embodiments, the conductive pillar 124a may serve as a drain pillar, and the conductive pillar 124b may serve as a source pillar. The conductive pillar 124a and the conductive pillar 124b are separated from each other. The conductive pillar 124a may be connected to the channel pillar 116. The conductive pillar 124b may be connected to the channel pillar 116. The isolation pillar 122a is located between the conductive pillar 124a and the conductive pillar 124b. The top T1 of the isolation pillar 122a is higher than a top T3 of the conductive pillar 124a and a top T4 of the conductive pillar 124b. The dielectric layer 118a is located between the dielectric liner layer 120a and the conductive pillar 124a and between the dielectric liner layer 120a and the conductive pillar 124b. The material of the conductive pillar 124a and the material of the conductive pillar 124b are, for example, doped polysilicon. In some embodiments, the conductive pillar 124a and the conductive pillar 124b may be simultaneously formed by the same process. In some embodiments, the forming method of the conductive pillar 124a and the conductive pillar 124b may include the following steps. First, a conductive material layer (not shown) filling the opening OP2 and the opening OP3 is formed. Next, an etch-back process is performed on the conductive material layer to form the conductive pillar 124a and the conductive pillar 124b. In some embodiments, the etch-back process may be a dry etching process.

Referring to FIG. 1H. A dielectric layer 126 may be formed on the dielectric liner layer 120a, the dielectric liner layer 120b, the isolation pillar 122a, the conductive pillar 124a, and the conductive pillar 124b. The material of the dielectric layer 126 is, for example, oxide (for example, silicon oxide). The forming method of the dielectric layer 126 is, for example, chemical vapor deposition.

In addition, the dielectric layer 126, the dielectric layer 120b, the dielectric layer 118b, the dielectric material layers 106, and the sacrificial layers 108 may be patterned to form multiple dielectric layers 106a and a separation trench (not shown) exposing the sacrificial layers 108. Then, the sacrificial layers 108 may be removed to form multiple openings OP4. In some embodiments, the removal method of the sacrificial layer 108 is, for example, wet etching. Next, the dielectric layer 112 may be removed. In some embodiments, the removal method of the dielectric layer 112 is, for example, wet etching.

Referring to FIG. 1I. Multiple charge storage structures 128 may be formed in the openings OP4. In some embodiments, the charge storage structure 150 may be a nitride layer/oxide layer (NO) composite layer or an oxide layer/nitride layer/oxide layer (ONO) composite layer, but the disclosure is not limited thereto.

In addition, multiple conductive layers 130 may be formed in the openings OP4. The conductive layer 130 may serve a gate. The conductive layers 130 may be formed on the charge storage structures 128. The conductive layers 130 may be separated from each other. Each charge storage structure 128 is located between the corresponding conductive layer 130 and the channel pillar 116. The material of the conductive layer 130 is, for example, a conductive material such as tungsten. In some embodiments, a barrier layer (not shown) may be formed between the conductive layer 130 and the charge storage structure 128, and the description thereof is omitted here. In some embodiments, the material of the barrier layer is, for example, aluminum oxide ($Al_2O_3$).

In some embodiments, the forming method of the charge storage structures 128 and the conductive layers 130 may include the following steps. First, a charge storage structure material layer (not shown) may be conformally formed in the openings OP4. Next, a conductive material layer (not shown) may be formed on the charge storage structure material layer and in the openings OP4. Then, an etch-back process (for example, a wet etching process) is performed on the conductive material layer to form the conductive layers 130. Next, an etch-back process (for example, a dry etching process) may be performed on the charge storage structure material layer to form the charge storage structures 128. In some embodiments, the charge storage structures 128 may extend to the outside of the openings OP4 and may be connected to each other.

By the above method, a stack structure SS2 may be formed on the substrate 100. In some embodiments, the stack structure SS2 may be formed on the stop layer 110. The stack structure SS2 includes the dielectric layers 106a and the conductive layers 130 alternately stacked. The channel pillar 116 passes through the stack structure.

Then, a dielectric layer 132 may be formed on the dielectric layer 126. The material of the dielectric layer 132 is, for example, oxide (for example, silicon oxide). The forming method of the dielectric layer 132 is, for example, chemical vapor deposition.

Next, a contact 134, a contact 136, a conductive line 138, and a conductive line 140 may be formed in the dielectric layer 132 and the dielectric layer 126. The contact 134 is located between the conductive line 138 and the conductive pillar 124a. The contact 134 and the conductive line 138 may be electrically connected to the conductive pillar 124a. The contact 136 is located between the conductive line 140 and the conductive pillar 124b. The contact 136 and the conductive line 140 may be electrically connected to the conductive pillar 124b. The contact 134, the contact 136, the conductive line 138, and the conductive line 140 may be formed by an interconnection process, and the description thereof is omitted here.

Hereinafter, a memory structure 10 of the above embodiment will be described with reference to FIG. 1I and FIG. 2. In addition, although the forming method of the memory structure 10 is described by taking the above method as an example, the disclosure is not limited thereto.

Referring to FIG. 1I and FIG. 2. The memory structure 10 includes the substrate 100, the stack structure SS2, the channel pillar 116, the charge storage structures 128, the conductive pillar 124a, the conductive pillar 124b, and the isolation pillar 122a. The memory structure 10 may be applied to a three-dimensional NOR flash memory or a three-dimensional AND flash memory.

The stack structure SS2 is located on the substrate 100. The stack structure SS2 includes the dielectric layers 106a and the conductive layers 130 alternately stacked. In addition, the number of the dielectric layers 106a and the number of the conductive layers 130 are not limited to the numbers shown in the drawings. As long as there are multiple dielectric layers 106a and multiple conductive layers 130, the same falls within the scope of the disclosure.

The channel pillar 116 passes through the stack structure SS2. Each charge storage structure 128 is located between the corresponding conductive layer 130 and the channel pillar 116. The conductive pillar 124a and the conductive pillar 124b are located within the channel pillar 116. The conductive pillar 124a and the conductive pillar 124b are separated from each other. The isolation pillar 122a is located between the conductive pillar 124a and the conductive pillar 124b. The top T1 of the isolation pillar 122a is higher than the top T3 of the conductive pillar 124a and the top T4 of the conductive pillar 124b. In addition, the shape of the channel pillar 116, the shape of the conductive pillar 124a, the shape of the conductive pillar 124b, and the shape of the isolation pillar 122a are not limited to the shapes in the drawings. That is, the shape of the channel pillar 116, the shape of the conductive pillar 124a, the shape of the conductive pillar 124b, and the shape of the isolation pillar 122a may be adjusted according to requirements.

The memory structure 10 may further include at least one of the dielectric liner layer 120a, the dielectric layer 118a, the dielectric layer 102, the stop layer 104a, the stop layer 104b, and the stop layer 110. The dielectric liner layer 120a is located on the sidewall S2 and the bottom surface S3 of the isolation pillar 122a. The dielectric layer 118a is located on the substrate 100. In some embodiments, the dielectric layer 118a may be located on the dielectric layer 102. The dielectric layer 118a is located between the dielectric liner layer 120a and the conductive pillar 124a and between the dielectric liner layer 120a and the conductive pillar 124b. The dielectric layer 102 is located on the substrate 100. The stop layer 104a is located in the dielectric layer 102. The conductive pillar 124a may be connected to the stop layer 104a. The stop layer 104b is located in the dielectric layer 102. The conductive pillar 124b may be connected to the stop layer 104b. The stop layer 110 is located between the stack structure SS2 and the dielectric layer 102.

In addition, for the remaining components in the memory structure 10, reference may be made to the description of the above embodiment. In addition, the detailed content (for example, the material, the forming method, etc.) of each component in the memory structure 10 has been described in detail in the above embodiment and will not be further described here.

Based on the above embodiment, it can be seen that in the memory structure 10 and a manufacturing method thereof, since the top T1 of the isolation pillar 122a is higher than the top T3 of the conductive pillar 124a (for example, the source pillar) and the top T4 of the conductive pillar 124b (for example, the drain pillar), unnecessary bridging between the conductive pillar 124a and the conductive pillar 124b can be effectively prevented, thereby preventing memory device failure.

Figure 3A:
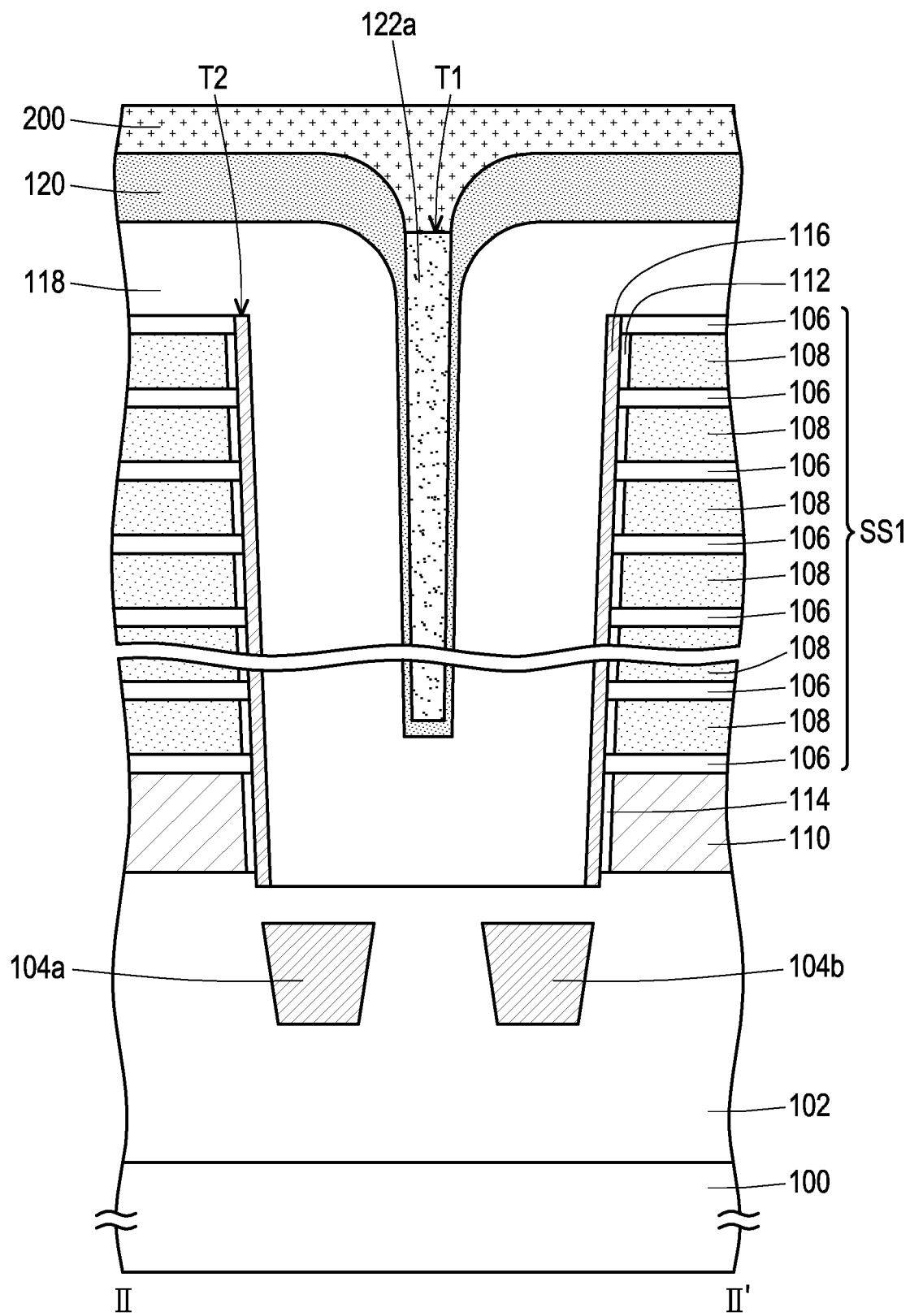
FIG. 3A to FIG. 3C are cross-sectional views of a manufacturing process of a memory structure according to other embodiments of the disclosure.
Figure 3B:
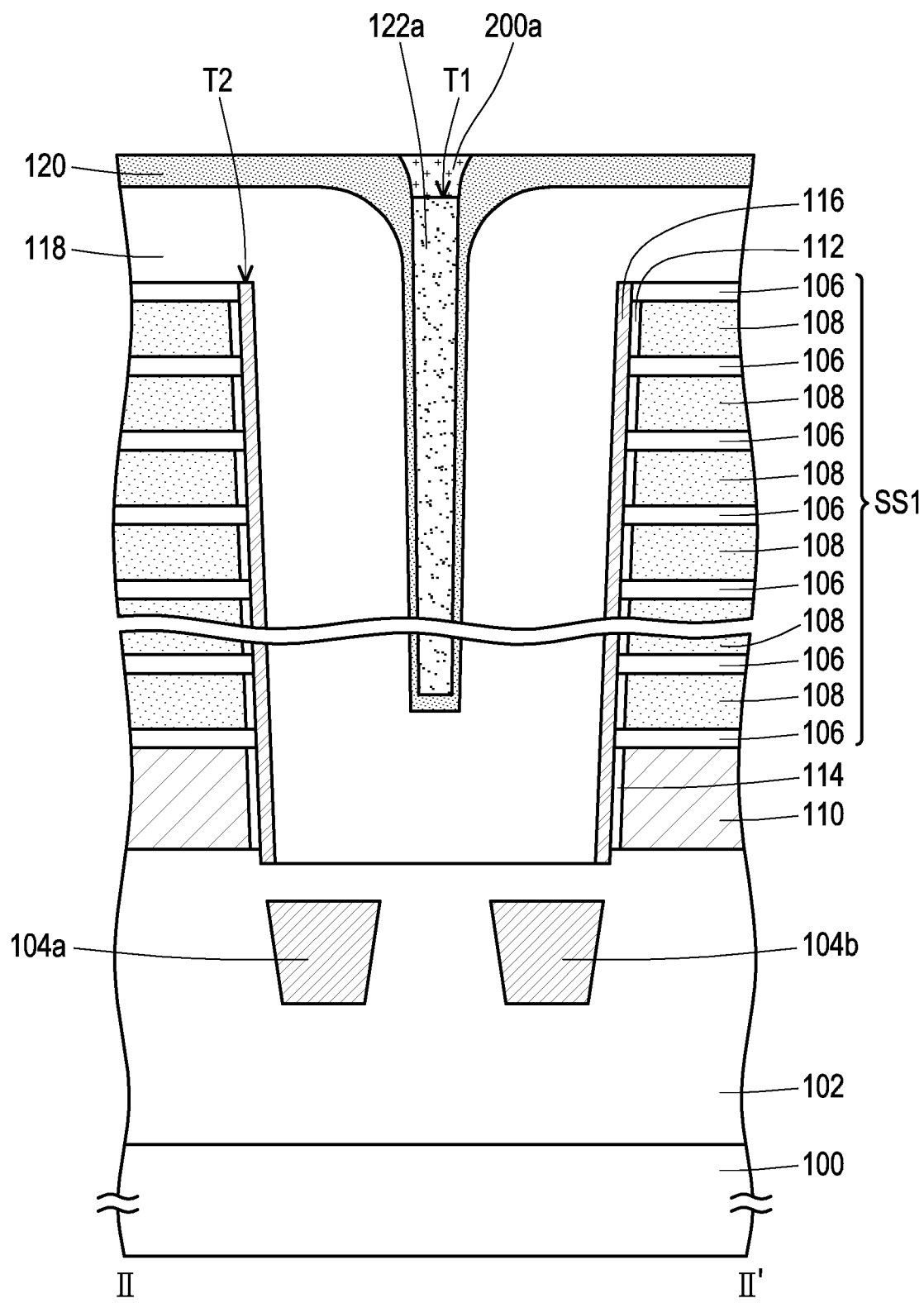
Figure 3C:
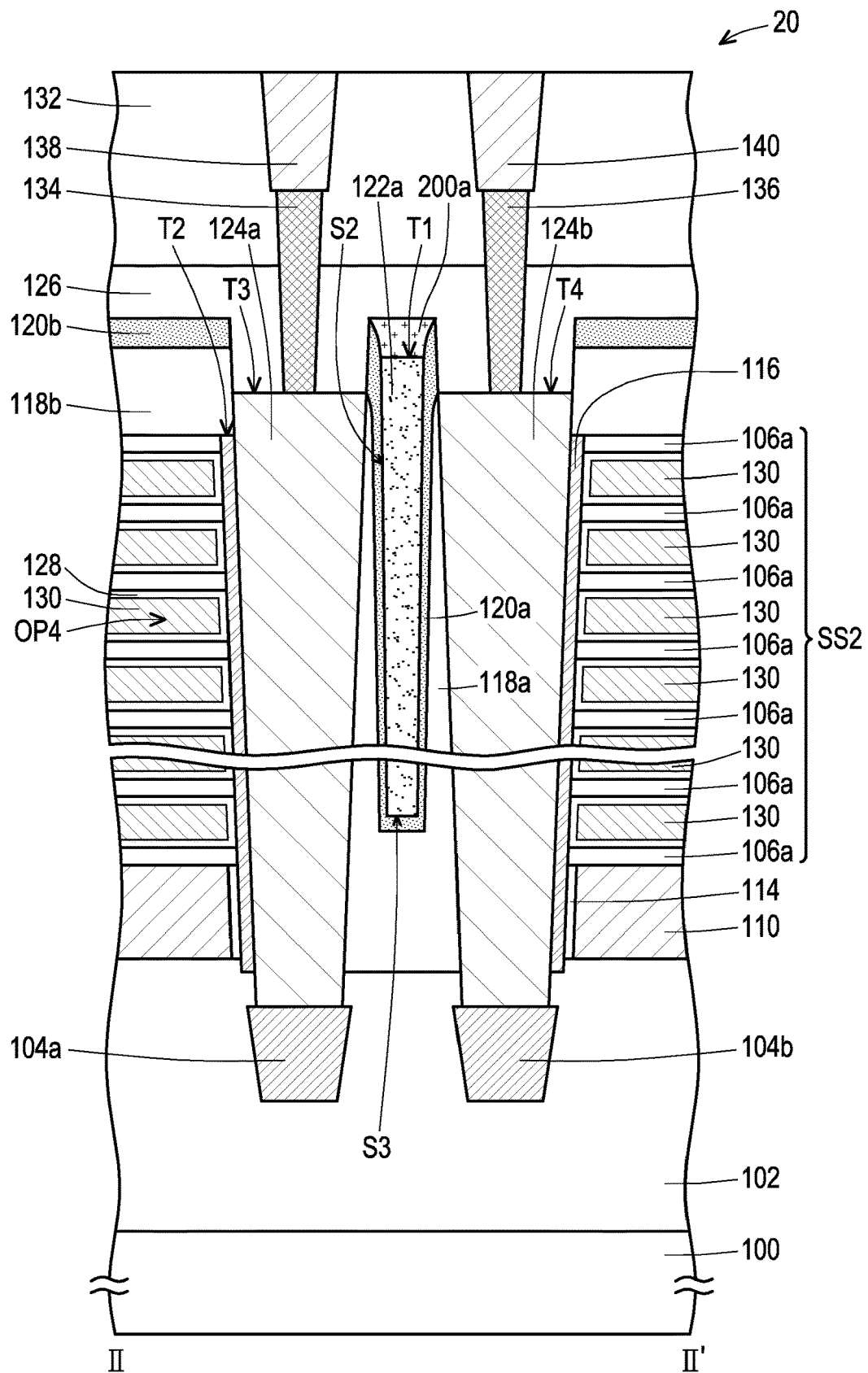
Figure 4:
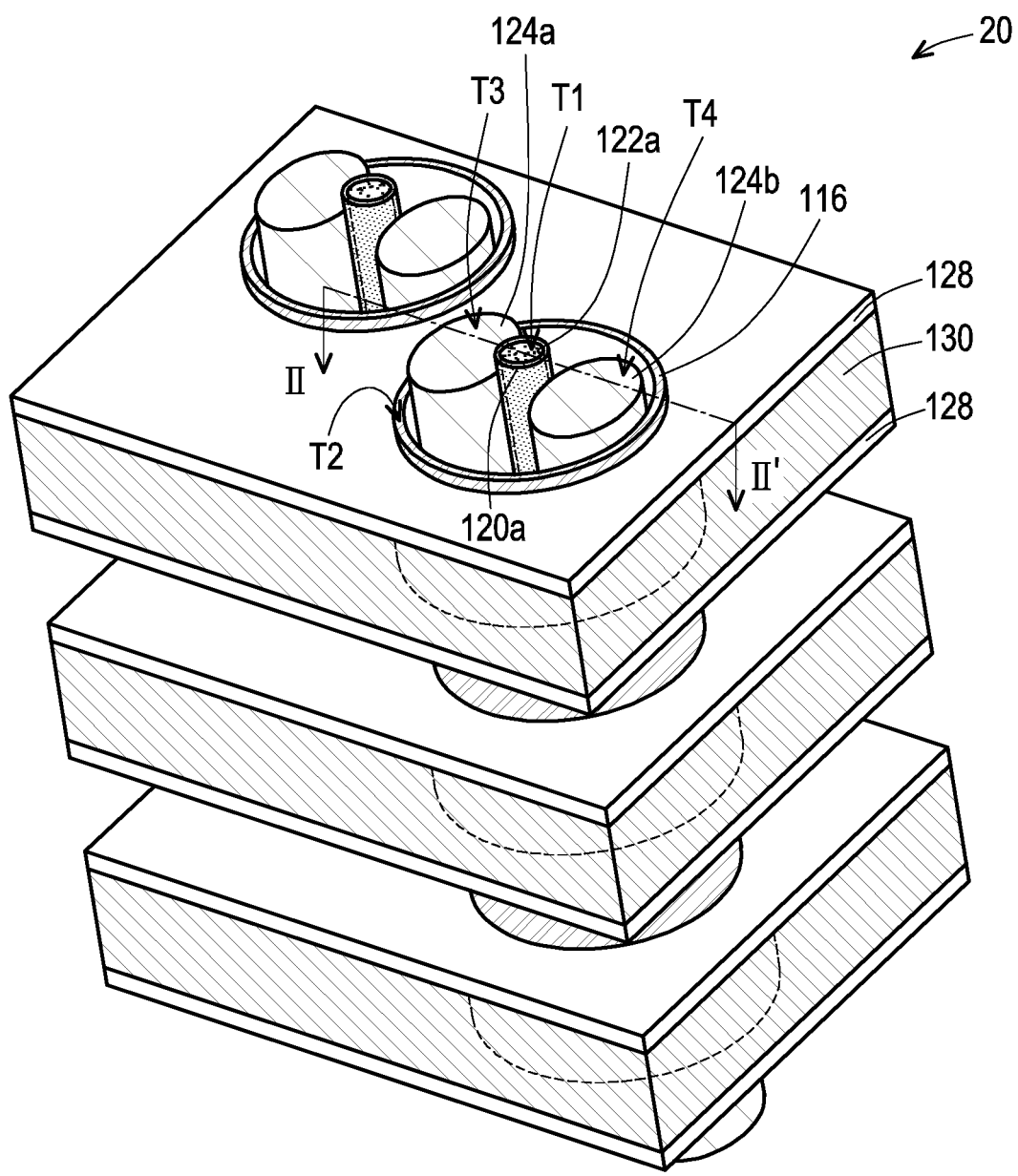
FIG. 4 is a perspective view of some components of the memory structure of FIG. 3C.

FIG. 3A to FIG. 3C are cross-sectional views of a manufacturing process of a memory structure according to other embodiments of the disclosure. FIG. 4 is a perspective view of some components of the memory structure of FIG. 3C. In the perspective view of FIG. 4, some components in the cross-sectional view of FIG. 3C are omitted to clearly illustrate the positional relationship between the components in the perspective view. FIG. 3A to FIG. 3C are cross-sectional views along a cross-sectional line II-II' in FIG. 4.

Referring to FIG. 3A, the structure shown in FIG. 1E is provided. In addition, the structure of FIG. 1E and the manufacturing method thereof have been described in detail in the above embodiment and will not be further described here.

Next, a capping material layer 200 may be formed on the dielectric liner material layer 120 and the isolation pillar 122a. The material of the capping material layer 200 is, for example, oxide (for example, silicon oxide). The forming method of the capping material layer 200 is, for example, chemical vapor deposition. In the embodiment, the material of the capping material layer 200 is, for example, high density plasma oxide, and the forming method of the capping material layer 200 is, for example, high density plasma chemical vapor deposition.

Referring to FIG. 3B. An etch-back process may be performed on the capping material layer 200 to form a capping layer 200a. Accordingly, the capping layer 200a may be formed on the isolation pillar 122a. The material of the capping layer 200a is, for example, oxide (for example, silicon oxide). In the embodiment, the material of the capping layer 200a is, for example, high density plasma oxide. The etch-back process is, for example, a dry etching process. In addition, a part of the dielectric liner material layer 120 may be removed during the etch-back process.

Next, the steps as of FIG. 1F to FIG. 1I may be performed to form a memory structure 20 of FIG. 3C. Hereinafter, the memory structure 20 of the above embodiment will be described with reference to FIG. 3C and FIG. 4. In addition, although the forming method of the memory structure 20 is described by taking the above method as an example, the disclosure is not limited thereto.

Referring to FIG. 1I, FIG. 2, FIG. 3C, and FIG. 4. The differences between the memory structure 20 and the memory structure 10 are as follows. The memory structure 20 may further include the capping layer 200a. The capping layer 200a is located on the top T1 of the isolation pillar 122a. The capping layer 200a may be connected to the dielectric liner layer 120a. The dielectric liner layer 120a and the capping layer 200a may surround the isolation pillar 122a.

In addition, in the memory structure 20 of FIG. 3C and the memory structure 10 of FIG. 1I, the same or similar components are represented by the same reference numerals, and the description thereof is omitted.

Based on the above embodiments, it can be seen that in the memory structure 20 and the manufacturing method thereof, since the top T1 of the isolation pillar 122a is higher than the top T3 of the conductive pillar 124a (for example, the source pillar) and the top T4 of the conductive pillar 124b (for example, the drain pillar), unnecessary bridging between the conductive pillar 124a and the conductive pillar 124b can be effectively prevented, thereby preventing memory device failure. Furthermore, since the capping layer 200a is located on the top T1 of the isolation pillar 122a, unnecessary bridging between the conductive pillar 124a and the conductive pillar 124b can be further prevented.

In summary, in the memory structure and the manufacturing method thereof according to the above embodiments, the memory structure includes the isolation pillar, and the top of the isolation pillar is higher than the top of the source pillar and the top of the drain pillar, so unnecessary bridging between the source pillar and the drain pillar can be effectively prevented, thereby preventing memory device failure.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A memory structure, comprising:
    a substrate;
    a stack structure located on the substrate and comprising first dielectric layers and conductive layers alternately stacked;
    a channel pillar passing through the stack structure;
    charge storage structures, wherein each of the charge storage structures is located between a corresponding one of the conductive layers and the channel pillar;
    a first conductive pillar and a second conductive pillar located within the channel pillar and separated from each other; and
    an isolation pillar located between the first conductive pillar and the second conductive pillar, wherein a top of the isolation pillar is higher than a top of the first conductive pillar and a top of the second conductive pillar.

2. The memory structure according to claim 1, wherein the top of the isolation pillar is higher than a top of the channel pillar.

3. The memory structure according to claim 1, wherein the first conductive pillar is connected to the channel pillar, and the second conductive pillar is connected to the channel pillar.

4. The memory structure according to claim 1, further comprising:
    a dielectric liner layer located on a sidewall and a bottom surface of the isolation pillar.

5. The memory structure according to claim 4, wherein a material of the dielectric liner layer comprises high density plasma oxide.

6. The memory structure according to claim 4, further comprising:
    a capping layer located on the top of the isolation pillar and connected to the dielectric liner layer.

7. The memory structure according to claim 6, wherein a material of the capping layer comprises high density plasma oxide.

8. The memory structure according to claim 6, wherein the dielectric liner layer and the capping layer surround the isolation pillar.

9. The memory structure according to claim 4, further comprising:
    a second dielectric layer located on the substrate and located between the dielectric liner layer and the first conductive pillar and between the dielectric liner layer and the second conductive pillar.

10. The memory structure according to claim 1, further comprising:
    a second dielectric layer located on the substrate;
    a first stop layer located in the second dielectric layer, wherein the first conductive pillar is connected to the first stop layer;

a second stop layer located in the second dielectric layer, wherein the second conductive pillar is connected to the second stop layer; and a third stop layer located between the stack structure and the second dielectric layer.

11. A manufacturing method of a memory structure, comprising:

providing a substrate;

forming a first stack structure on the substrate, wherein the first stack structure comprises first dielectric layers and conductive layers alternately stacked;

forming a channel pillar, wherein the channel pillar passes through the stack structure;

forming charge storage structures, wherein each of the charge storage structures is located between a corresponding one of the conductive layers and the channel pillar;

forming a first conductive pillar and a second conductive pillar within the channel pillar, wherein the first conductive pillar and the second conductive pillar are separated from each other; and forming an isolation pillar, wherein the isolation pillar is located between the first conductive pillar and the second conductive pillar, and a top of the isolation pillar is higher than a top of the first conductive pillar and a top of the second conductive pillar.

12. The manufacturing method of the memory structure according to claim 11, wherein a forming method of the first stack structure comprises:

forming a second stack structure on the substrate, wherein the second stack structure comprises first dielectric material layers and sacrificial layers alternately stacked, the second stack structure has a first opening, and the first opening passes through the second stack structure;

patterning the first dielectric material layers to form the first dielectric layers;

removing the sacrificial layers to form second openings; and forming the conductive layers in the second openings.

13. The manufacturing method of the memory structure according to claim 12, wherein the charge storage structures are formed in the second openings, and the conductive layers are formed on the charge storage structures.

14. The manufacturing method of the memory structure according to claim 12, wherein the channel pillar is formed on a sidewall of the first opening.

15. The manufacturing method of the memory structure according to claim 12, wherein a forming method of the isolation pillar comprises:

forming a second dielectric material layer in the first opening, wherein the second dielectric material layer has a recess;

forming a dielectric liner material layer on the second dielectric material layer and in the recess;

forming an isolation material layer on the dielectric liner material layer and in the recess; and performing an etch-back process on the isolation material layer to form the isolation pillar.

16. The manufacturing method of the memory structure according to claim 15, wherein a forming method of the dielectric liner material layer comprises high density plasma chemical vapor deposition.

17. The manufacturing method of the memory structure according to claim 15, wherein a forming method of the first conductive pillar and the second conductive pillar comprises:

patterning the dielectric liner material layer and the second dielectric material layer to form a third opening and a fourth opening; and forming the first conductive pillar in the third opening and forming the second conductive pillar in the fourth opening.

18. The manufacturing method of the memory structure according to claim 15, wherein the dielectric liner material layer is patterned into a dielectric liner layer, and the dielectric liner layer is located on a sidewall and a bottom surface of the isolation pillar.

19. The manufacturing method of the memory structure according to claim 18, further comprising:

forming a capping layer on the isolation pillar, wherein the capping layer is connected to the dielectric liner layer.

20. The manufacturing method of the memory structure according to claim 15, wherein the second dielectric material layer is patterned into a second dielectric layer, and the second dielectric layer is located between the dielectric liner layer and the first conductive pillar and between the dielectric liner layer and the second conductive pillar.

* * * * *